United States Patent
Rutkowski et al.

(10) Patent No.: US 12,235,293 B2
(45) Date of Patent: Feb. 25, 2025

(54) SENSOR MIRROR CIRCUITRY WITH REDUCED ERROR COMPOUNDING

(71) Applicant: FORD GLOBAL TECHNOLOGIES, LLC, Dearborn, MI (US)

(72) Inventors: Brian D Rutkowski, Ypsilanti, MI (US); David John Rutkowski, Grosse Ile, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 363 days.

(21) Appl. No.: 17/951,753

(22) Filed: Sep. 23, 2022

(65) Prior Publication Data
US 2024/0103555 A1   Mar. 28, 2024

(51) Int. Cl.
| | |
|---|---|
| *G01R 19/00* | (2006.01) |
| *G01P 3/44* | (2006.01) |
| *G05F 3/16* | (2006.01) |
| *H03F 3/345* | (2006.01) |
| *H03K 5/24* | (2006.01) |

(52) U.S. Cl.
CPC ............ *G01R 19/0092* (2013.01); *G01P 3/44* (2013.01); *G05F 3/16* (2013.01); *H03F 3/345* (2013.01); *H03K 5/2472* (2013.01)

(58) Field of Classification Search
CPC ......... G01P 3/44; G01R 19/0092; G05F 3/16; H03F 3/345; H03F 2200/474; H03F 3/347; H03F 3/45475; H03K 5/2472
See application file for complete search history.

(56) References Cited

U.S. PATENT DOCUMENTS

| | | | |
|---|---|---|---|
| 3,326,434 A | 6/1967 | Joseph | |
| 5,218,298 A * | 6/1993 | Vig | G01R 33/07 340/661 |
| 6,002,338 A | 12/1999 | Pavlov et al. | |
| 6,897,717 B1 * | 5/2005 | Eddleman | G05F 3/262 327/108 |
| 7,663,928 B2 | 2/2010 | Tsai et al. | |
| 8,994,452 B2 | 3/2015 | Kim et al. | |
| 9,588,541 B1 | 3/2017 | Ho et al. | |
| 10,215,799 B2 | 2/2019 | Douglas et al. | |
| 10,964,743 B2 | 3/2021 | Kurokawa | |

FOREIGN PATENT DOCUMENTS

| | | |
|---|---|---|
| DE | 102019205175 A1 | 10/2020 |
| EP | 3326434 B1 | 12/2020 |
| JP | 6212225 B2 | 10/2017 |

\* cited by examiner

*Primary Examiner* — Jay Patidar
(74) *Attorney, Agent, or Firm* — Frank Lollo; Brooks Kushman P.C.

(57) ABSTRACT

Sense mirror circuitry receives a voltage signal having values corresponding to a magnitude of a measured current. Responsive to the values falling within a first predefined range, the sense mirror circuitry outputs a current at a first predefined magnitude that corresponds to the first predefined range. Responsive to the values falling within a second predefined range, the sense mirror circuitry outputs a current at a second predefined magnitude different than the first predefined magnitude and that corresponds to the second predefined range.

20 Claims, 3 Drawing Sheets

SENSOR MIRROR CIRCUITRY WITH REDUCED ERROR COMPOUNDING

TECHNICAL FIELD

This disclosure relates to circuitry used in automotive vehicles.

BACKGROUND

Current mirror circuitry can copy current through one active device by controlling current in another active device while keeping the output current constant regardless of loading. The current being copied can be contained within a varying signal.

Several parameters may be used to characterize a current mirror. The first may be the transfer ratio in the case of a current amplifier or the output current magnitude in the case of a constant current source. The second may be the AC output resistance, which determines how much the output current varies with the voltage applied to the mirror. The third may be the minimum voltage drop across the output necessary for proper operation. The range of voltages in which the mirror works is referred to as the compliance range and the corresponding voltage boundary is referred to as the compliance voltage. Temperature stability and other factors also can affect performance.

SUMMARY

A sensor mirror includes mirror circuitry that receives a voltage signal having values corresponding to a magnitude of a measured current. Responsive to the values falling within a first predefined range, the mirror circuitry outputs a current at a first predefined magnitude that corresponds to the first predefined range, and responsive to the values falling within a second predefined range, the mirror circuitry outputs a current at a second predefined magnitude different than the first predefined magnitude that corresponds to the second predefined range.

The mirror circuitry may include a plurality of comparators arranged to detect whether the values fall within the first predefined range or the second predefined range. The plurality may include a first pair of comparators arranged to detect whether the values fall within the first predefined range, and a second pair of comparators arranged to detect whether the values fall within the second predefined range. The first pair of comparators may be further arranged to output high signals responsive to the values falling within the first predefined range. The first pair of comparators may be further arranged to output at least one low signal responsive to the values falling outside the first predefined range. The first and second predefined magnitudes may be respectively nominal values of specified ranges of values. The mirror circuitry may further output the current at a predefined slew rate that is defined as a nominal value of a specified range of values.

A wheel speed sensing and mirror system includes a wheel speed sensor that outputs a measured current, threshold circuitry that detects whether a voltage corresponding to the measured current has a value that falls within a first predefined range or a second predefined range, selection circuitry that outputs a first signal responsive to the value falling with the first predefined range and a second signal different than the first signal responsive to the value falling within the second predefined range, and source circuitry that outputs current at a first predefined magnitude responsive to the first signal and outputs current at a second predefined magnitude different than the first predefined magnitude responsive to the second signal.

The wheel speed sensing and mirror system may further include a resistor, and the wheel speed sensor may be grounded via the resistor such that the resistor generates the voltage. The threshold circuitry may include a first pair of comparators arranged to detect whether the value falls within the first predefined range, and a second pair of comparators arranged to detect whether the value falls within the second predefined range. The first pair of comparators may be further arranged to output high signals responsive to the value falling within the first predefined range. The first pair of comparators may be further arranged to output at least one low signal responsive to the value falling outside the first predefined range. The selection circuitry may include a plurality of switches each having a gate connected with outputs of one of the pair of comparators. The switches may be N-type metal-oxide-semiconductor field-effect transistors. The selection circuitry may further include a plurality of resistors, and each of the switches may have a source grounded via one of the resistors. The first and second predefined magnitudes may be respectively nominal values of specified ranges of values. The source circuitry may further output the current at a predefined slew rate.

A mirror sensing system includes a sensor that outputs a measured current, a first pair of comparators arranged to detect whether a voltage corresponding to the measured current has a value that falls within a first range of values, a second pair of comparators arranged to detect whether the voltage has a value that falls within a second range of values, and a plurality of switches and resistors arranged to output a first signal responsive to the first pair of comparators indicating the value falls within the first range of values, and to output a second signal different than the first signal responsive to the second pair of comparators indicating the value falls within the second range of values.

The mirror sensing system may include a plurality of resistors, and each of the switches may have a terminal grounded via one of the resistors. The mirror sensing system may include a power source and a resistor, and each of the switches may have a terminal connected to the power source via the resistor. The first pair of comparators may output high signals when indicating the value falls within the first range.

BRIEF DESCRIPTION OF THE DRAWINGS

In the following detailed description, reference is made to the accompanying figures, and in which are shown by way of illustration specific embodiments. Other embodiments of course are also contemplated and/or described.

DETAILED DESCRIPTION

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Output from certain vehicle sensors may not be able to be sent to multiple electronic control units (ECUs). One reason may be because the sensors are analog and different ECUs have different ground offsets: the ground offset will add to the analog signal and result in a measurement error. Another reason may be because the signal is in a current loop and measuring the current requires a grounded sense resistor or a sense resistor referenced to the positive rail.

Wheel speed sensors used on some vehicles encode the wheel speed signal in a current loop that uses three currents: high, medium, and low. The transition between the currents encodes the speed, direction, and other information about the sensor interface. Typical sensor mirror circuitry would measure the signal and replicate a current equal to the same. Errors, however, can be associated with the measurement and replication process. If the incoming signal is at or near the tolerance limit, the replicated signal may be outside the tolerance limit. Likewise, if the incoming signal rise/fall time is at or near the tolerance limit, the replicated signal may be outside the tolerance limit. In many instances, the replicated rise/fall time cannot be lower (i.e., faster) than the incoming signal.

Figure 1:
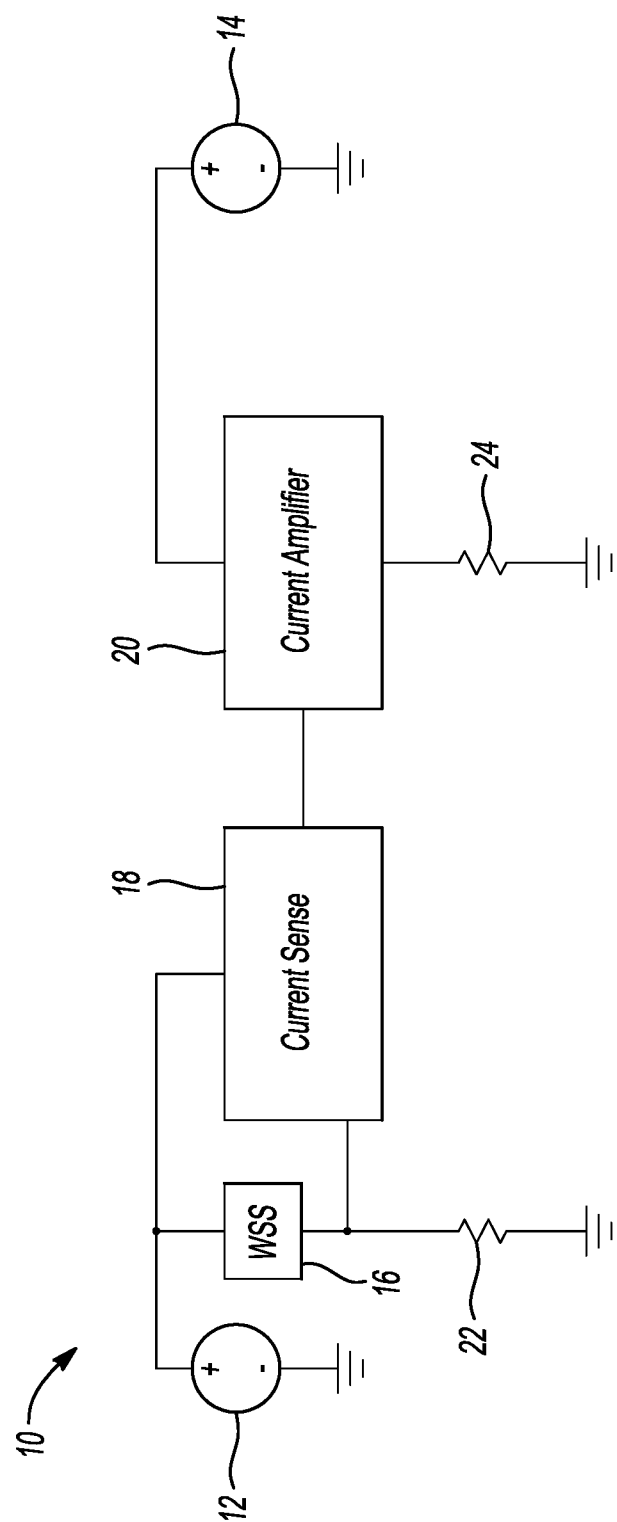
FIG. 1 is a schematic diagram of a typical sense mirror circuitry arrangement.

Referring to FIG. 1, a typical wheel speed sensing and current mirror arrangement 10 includes voltage sources 12, 14, wheel speed sensor 16, current sense circuitry 18, current amplifier circuitry 20, and resistors 22, 24. The wheel speed sensor 16 receives power via the voltage source 12 and is grounded via the resistor 22. The resistor 22 converts the current signal generated by the wheel speed sensor 16 to a voltage. The current sense circuitry 18 measures the voltage across the resistor 22 with an accuracy of approximately plus or minus two percent. The current amplifier circuitry 20 receives power via the voltage source 14 and is grounded via the resistor 24. The current amplifier 20 sends current "mirroring" the wheel speed sensor current across the resistor 24. It performs this operation with an accuracy of approximately plus or minus five percent, and may add up to approximately 10 milliseconds to the rise and/or fall times associated with the signals.

Sensor mirror circuitry is thus proposed that does not compound such errors. This circuitry, however, may not use all the parameters of the incoming signal. Instead, if the incoming signal meets the current level requirements, it outputs a signal that is in the nominal range of current level and timing, which are defined by specification.

The wheel speed signal, in one example, is measured by the host ECU. If the incoming signal is within the appropriate current band, the circuit sends a signal within the acceptable current range. Even if the incoming signal is at an extreme level of a specified range, the outgoing signal will be at the nominal level of the specified range. If the rise/fall times (slew rate) of the current is at the minimum or maximum specified levels, the outgoing signal will be at the nominal rise/fall time between the specified levels. If the mirror circuit merely tried to duplicate the incoming signal, any error in the measurement of the incoming signal would be carried forward in addition to errors introduced by the mirror circuit.

In one example, discrete voltage comparators are used to sense the current levels. Alternatively, a microprocessor with analog inputs and digital outputs could be used to command the current source. A different circuit for generating the output currents could also be used. Another example would put all the components in an application specific integrated circuit for a smaller printed circuit board footprint. End of line calibration could then be used to improve the current accuracy and adjust the rise/fall times.

Figure 2:
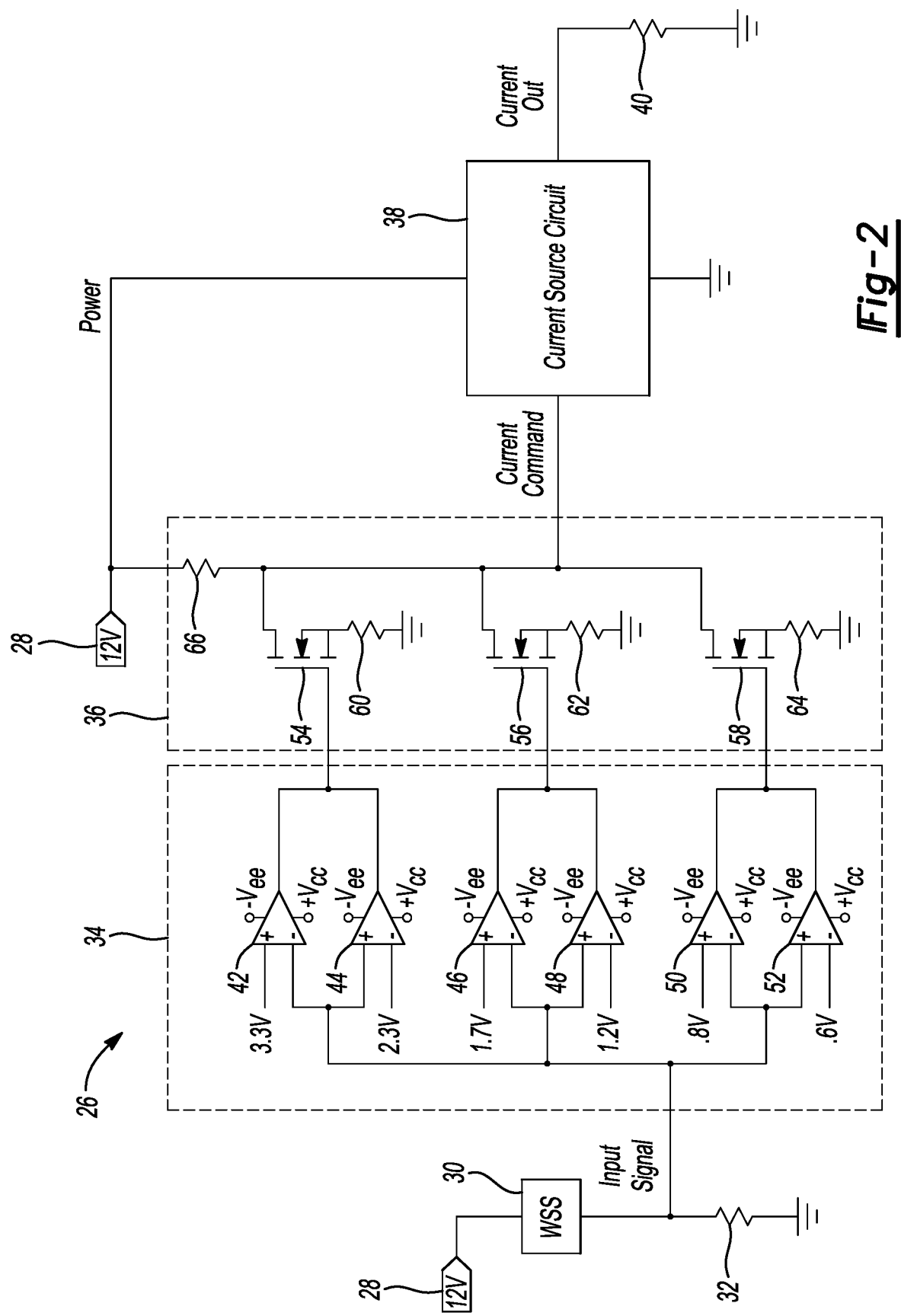
FIG. 2 is a schematic diagram of an example sense mirror circuitry arrangement.

Referring to FIG. 2, a wheel speed sensing and current mirror arrangement 26 includes a voltage source 28, wheel speed sensor 30, resistor 32, threshold detecting circuitry 34, current selection circuitry 36, current source circuitry 38, and resistor 40. The threshold detecting circuitry 34 includes comparators 42, 44, 46, 48, 50, 52. The current selection circuitry 36 includes switches 54, 56, 58 (e.g., N-type metal-oxide-semiconductor field-effect transistors) and resistors 60, 62, 64, 66.

The wheel speed sensor 30 receives power via voltage source 28 and is grounded via the resistor 32. The resistor 32 converts the current signal generated by the wheels speed sensor 30 to a voltage. This input signal is provided to the threshold detecting circuitry 34.

The comparators 42, 44, 46, 68, 50, 52 are arranged in pairs to define threshold pairs. The comparators 42, 44 form a first threshold pair, the comparators 46, 48 form a second threshold pair, and the comparators 50, 52 form a third threshold pair. Each threshold pair operates to determine whether the voltage value of the input signal falls within a particular range. In the example of FIG. 2, the range defined by the first threshold pair is 2.3V to 3.3V, the range defined by the second threshold pair is 1.2V and 1.7V, and the range defined by the third threshold pair is 0.6V to 0.8V. As such, the comparator 42 has a 3.3V source connected with its positive input and the input signal line connected with its negative input. The comparator 44 has the input signal line connected with its positive input and a 2.3V source connected with its negative input. The comparator 46 has a 1.7V source connected with its positive input and the input signal line connected with its negative input. The comparator 48 has the input signal line connected with its positive input and a 1.2V source connected with its negative input. The comparator 50 has a 0.8V source connected with its positive input and the input signal line connected with its negative input. The comparator 52 has the input signal line connected with its positive input and a 0.6V source connected with its negative input. Other ranges may of course be used depending on, for example, the specified voltage levels that may be output by the sensor being used.

Given this arrangement, if the signal line has a value of 0.7V, the comparators 50, 52 will output high signals (because 0.7V is greater than 0.6V and less than 0.8V), the comparators 42, 46 will also output high signals (because 0.7V is less than 3.3V and less than 1.7V), and the comparators 44, 48 will output low signals (because 0.7V is not greater than 2.3 V and not greater than 1.2V). If the signal line has a value of 2.6V, the comparators 42, 44 will output high signals, the comparators 48, 52 will also output high signals, and the comparators 46, 50 will output low signals.

A gate of each of the switches 54, 56, 58 is connected with one of the pairs of comparators. The gate of the switch 54 is connected with the outputs of the comparators 42, 44. The gate of the switch 56 is connected with the outputs of the comparators 46, 48. The gate of the switch 58 is connected with the outputs of the comparators 50, 52. A source of each of the switches 54, 56, 58 is grounded via a resistor. The source of the switch 54 is ground via resistor 60. The source of the switch 56 is grounded via the resistor 62. The source of the switch 58 is grounded via the resistor 64. A drain of each of the switches 54, 56, 58 is connected to the power source 28 via the resistor 66.

When both comparators of a comparator pair output a high signal, the corresponding gate will activate, permitting current flow therethrough. When for example the comparators 42, 44 output a high signal, the gate of the switch 54 will activate, permitting current flow through the switch 54 and across the resistors 60, 66. When the comparators 46, 48 output a high signal, the gate of the switch 56 will activate, permitting current flow through the switch 56 and across the resistors 62, 66, and so on. If either or both comparators of a comparator pair output a low signal, the corresponding gate will not activate. If for example, the comparator 50 outputs a high signal and the comparator 52 outputs a low signal, the gate of the switch 58 will not active, preventing current flow through the switch 58. If both the comparators 50, 52 output a low signal, the gate of the switch 58 will not active, and so no.

Current command values for the current source circuit 38 are defined by a ratio of the resistance of the resistor 66 to each of the resistances of the resistors 60, 62, 64, which are different. When the switch 54 is activated for example, current will flow through the resistors 60, 66 as mentioned above. A voltage drop will occur across each of the resistors 60, 66. This voltage drop will be different than when the switch 56 is activated or the switch 58 is activated. The voltage on the current command line will thus be different based on which of the switches 54, 56, 58 is activated.

Depending on the current command value, the current source circuit 38 is configured to output a current signal at a nominal value within the range corresponding to the current command value with a specified rise/fall time as mentioned above. That is, whether the voltage value of the input signal to the threshold detecting circuitry 34 is 2.4V, 2.8V, or 3.2V, the same current will be output by the current source circuit 38. Whether the voltage value of the input signal to the threshold detecting circuitry 34 is 1.3V, 1.4V, or 1.6V, the same current will be output by the current source circuit 38, and have a different value than when the input signal to the threshold detecting circuitry falls within the 2.3V to 3.3V range or the 0.6V to 0.8V range. To the extent there is information contained in the input signal falling within one of the three ranges mentioned, this information is being mirrored without the possible errors discussed with regard to previous current mirror arrangements. In this example, the output current levels and rise/fall times are designed to meet the wheel speed sensor specification, independent of the input from the wheels speed sensor 30.

Figure 3:
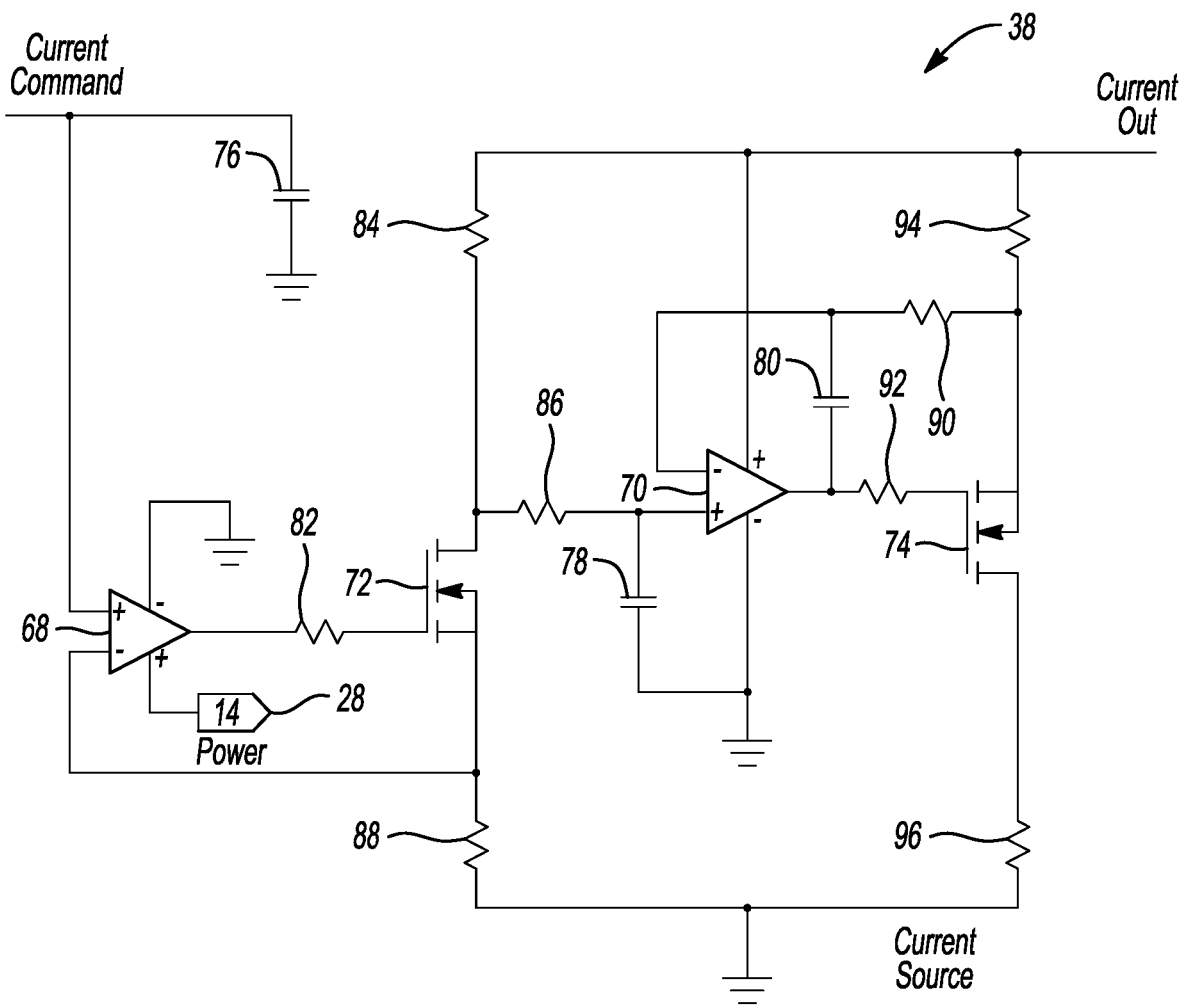
FIG. 3 is a schematic diagram of a portion of the example sense mirror circuitry arrangement of FIG. 2.

Referring to FIG. 3, the current source circuit 38 includes comparators 68, 70, switches 72, 74, capacitors 76, 78, 80, and resistors 82, 84, 86, 88, 90, 92, 94, 96. The current command line is grounded via the capacitor 76. The positive input of the comparator 68 is connected with the current command line. The negative input of the comparator 68 is connected with the source of the switch 72, and is grounded via the resistor 88. The gate of the switch 72 is connected with the output of the comparator 68 via the resistor 82. The positive input of the comparator 70 is connected with the drain of the switch 72 via the resistor 86, is grounded via the capacitor 78, and is connected with the current out line via the resistors 84, 86. The negative input of the comparator 70 is connected with the output of the comparator 70 via the capacitor 80, with the current out line via the resistors 90, 94, and with the drain of the switch 74 via the resistor 90. The gate of the switch 74 is connected with the output of the comparator 70 via the resistor 92. The source of the switch 74 is grounded via the resistor 96.

Figure 4:
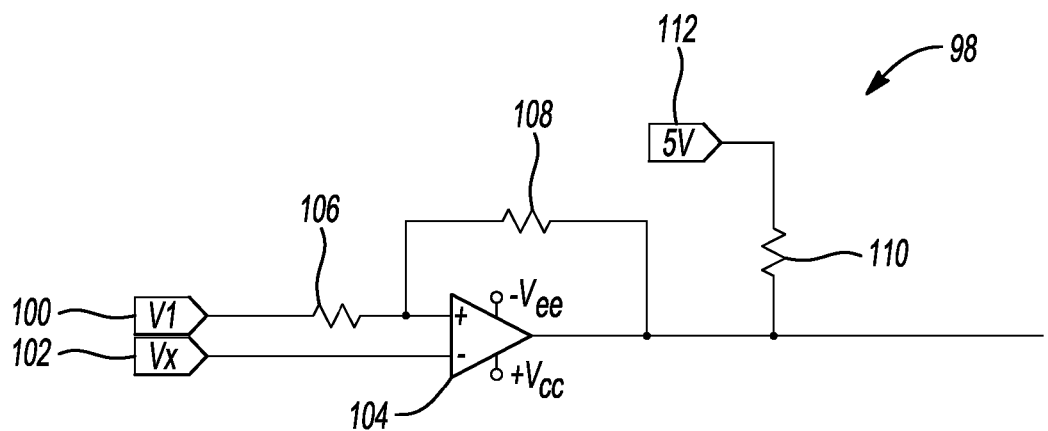
FIG. 4 is a schematic diagram of an example hysteresis circuit that can be used with the example sense mirror circuitry arrangement of FIG. 2.

Referring to FIG. 4, to the extent hysteresis effects are of concern with regard to the pairs of comparators of FIG. 2, circuitry 98 may be used to reduce such effects. The circuitry 98 includes a threshold line 100, signal input line 102, comparator 104, resistors 106, 108, 110, and power source 112. The positive input of the comparator 104 is connected to the threshold line 100 via the resistor 106. The negative input of the comparator 104 is connected to the signal input line 102. The output of the comparator 104 is connected to the positive input of the comparator via the resistor 108, and to the voltage source 112 via the resistor 110. The ratio of the resistance of the resistor 106 to the resistance of the resistor 108 can be tuned to set the hysteresis tolerance of the circuitry 98. This can be used for each comparator arrangement of the threshold detecting circuitry 34, with consideration of connections to the positive and negative inputs of the comparator based on whether an upper or lower threshold is being established.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. Other embodiments could use a microprocessor with analog inputs and digital outputs to command the current source. Alternatively, the components could be manifested in an application specific integrated circuit, etc.

The words used in the specification are words of description rather than limitation, and it is understood that various changes may be made without departing from the spirit and scope of these disclosed materials.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A sensor mirror comprising:
mirror circuitry configured to receive a voltage signal having values corresponding to a magnitude of a measured current, responsive to the values falling within a first predefined range, output a current at a first predefined magnitude that corresponds to the first predefined range, and responsive to the values falling within a second predefined range, output a current at a second predefined magnitude different than the first predefined magnitude and that corresponds to the second predefined range.

2. The sensor mirror of claim 1, wherein the mirror circuitry includes a plurality of comparators arranged to detect whether the values fall within the first predefined range or the second predefined range.

3. The sensor mirror of claim 2, wherein the plurality includes a first pair of comparators arranged to detect whether the values fall within the first predefined range, and a second pair of comparators arranged to detect whether the values fall within the second predefined range.

4. The sensor mirror of claim 3, wherein the first pair of comparators are further arranged to output high signals responsive to the values falling within the first predefined range.

5. The sensor mirror of claim 4, wherein the first pair of comparators are further arranged to output at least one low signal responsive to the values falling outside the first predefined range.

6. The sensor mirror of claim 1, wherein the first and second predefined magnitudes are respectively nominal values of specified ranges of values.

7. The sensor mirror of claim 1, wherein the mirror circuitry is further configured to output the current at a predefined slew rate that is defined as a nominal value of a specified range of values.

8. A wheel speed sensing and mirror system comprising:
a wheel speed sensor configured to output a measured current;
threshold circuitry configured to detect whether a voltage corresponding to the measured current has a value that falls within a first predefined range or a second predefined range;
selection circuitry configured to output a first signal responsive to the value falling with the first predefined range and a second signal different from the first signal responsive to the value falling within the second predefined range; and
source circuitry configured to output current at a first predefined magnitude responsive to the first signal and output current at a second predefined magnitude different from the first predefined magnitude responsive to the second signal.

9. The wheel speed sensing and mirror system of claim 8 further comprising a resistor, wherein the wheel speed sensor is grounded via the resistor such that the resistor generates the voltage.

10. The wheel speed sensing and mirror system of claim 8, wherein the threshold circuitry includes a first pair of comparators arranged to detect whether the value falls within the first predefined range, and a second pair of comparators arranged to detect whether the value falls within the second predefined range.

11. The wheel speed sensing and mirror system of claim 10, wherein the first pair of comparators are further arranged to output high signals responsive to the value falling within the first predefined range.

12. The wheel speed sensing and mirror system of claim 11, wherein the first pair of comparators are further arranged to output at least one low signal responsive to the value falling outside the first predefined range.

13. The wheel speed sensing and mirror system of claim 10, wherein the selection circuitry includes a plurality of switches each having a gate connected with outputs of one of the pair of comparators.

14. The wheel speed sensing and mirror system of claim 13, wherein the switches are N-type metal-oxide-semiconductor field-effect transistors.

15. The wheel speed sensing and mirror system of claim 14, wherein the selection circuitry further includes a plurality of resistors and wherein each of the switches has a source grounded via one of the resistors.

16. The wheel speed sensing and mirror system of claim 8, wherein the first and second predefined magnitudes are respectively nominal values of specified ranges of values and wherein the source circuitry is further configured to output the current at a predefined slew rate.

17. A mirror sensing system comprising:
a sensor configured to output a measured current;
a first pair of comparators arranged to detect whether a voltage corresponding to the measured current has a value that falls within a first range of values;
a second pair of comparators arranged to detect whether the voltage has a value that falls within a second range of values; and
a plurality of switches and resistors arranged to output a first signal responsive to the first pair of comparators indicating the value falls within the first range of values, and to output a second signal different than the first signal responsive to the second pair of comparators indicating the value falls within the second range of values.

18. The mirror sensing system of claim 17 comprising the plurality of resistors, wherein each of the switches has a terminal grounded via one of the resistors.

19. The mirror sensing system of claim 17 further comprising a power source and a resistor, wherein each of the switches has a terminal connected to the power source via the resistor.

20. The mirror sensing system of claim 17, wherein the first pair of comparators output high signals when the value falls within the first range.

* * * * *